(12) United States Patent
Lesso et al.

(10) Patent No.: US 10,554,189 B2
(45) Date of Patent: Feb. 4, 2020

(54) ANALOGUE SIGNAL PATHS

(71) Applicant: Cirrus Logic International Semiconductor Ltd., Edinburgh (GB)

(72) Inventors: John Paul Lesso, Edinburgh (GB); Seyed Hamed Sadati, Swindon (GB); Yu Tamura, Yokohama (JP)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/992,847

(22) Filed: May 30, 2018

(65) Prior Publication Data

US 2018/0351523 A1 Dec. 6, 2018

Related U.S. Application Data

(60) Provisional application No. 62/514,333, filed on Jun. 2, 2017.

(30) Foreign Application Priority Data

Jul. 11, 2017 (GB) .................................. 1711162.6
Dec. 21, 2017 (GB) .................................. 1721539.3

(51) Int. Cl.
*H03G 3/30* (2006.01)
*H03G 3/32* (2006.01)
*H04R 3/00* (2006.01)

(52) U.S. Cl.
CPC .............. *H03G 3/301* (2013.01); *H03G 3/32* (2013.01); *H04R 3/00* (2013.01)

(58) Field of Classification Search
CPC ........ H03F 3/2175; H03F 3/183; H03F 3/187; H03F 2200/03; H03F 1/3264;

(Continued)

(56) References Cited

U.S. PATENT DOCUMENTS

| 7,362,821 B1 | 4/2008 | Shirali | |
| 2008/0269926 A1* | 10/2008 | Xiang | H03G 3/32 700/94 |

(Continued)

FOREIGN PATENT DOCUMENTS

WO 2006039510 A1 4/2006

OTHER PUBLICATIONS

Combined Search and Examination Report, UKIPO, Application No. GB1711162.6, dated Jan. 11, 2018.

(Continued)

*Primary Examiner* — Yogeshkumar Patel
(74) *Attorney, Agent, or Firm* — Jackson Walker L.L.P.

(57) ABSTRACT

This application relates to audio circuits, such as audio driving circuits, with improved audio performance. An audio arrangement (200) has an audio circuit (201) with a forward signal path between an input (102) for an input digital audio signal ($D_{IN}$) and an output (103) for an output analogue audio signal ($A_{OUT}$). The circuit also has a feedback path comprising an analogue-to-digital conversion module (202) for receiving an analogue feedback signal ($V_{FB}$) derived from the output analogue audio signal and outputting a corresponding digital feedback signal ($D_{FB}$). The analogue-to-digital conversion module (202) has an ADC (108), an analogue gain element (203) configured to apply analogue gain ($G_A$) to the analogue feedback signal before the ADC and a digital gain element (204) for applying digital gain ($G_D$) to a signal output from the ADC. A gain controller (205) controls the analogue gain and the digital gain applied based on the input digital audio signal ($D_{IN}$).

20 Claims, 5 Drawing Sheets

(58) Field of Classification Search
CPC .......... H03F 3/181; H03F 1/32; H03F 1/3247;
H03F 2200/129; H03M 1/00; H03M 1/18;
H03M 1/181; H03M 1/70; H03M 3/51;
H04R 3/00; H04R 2499/11; H04R
2430/01; H03G 3/3089; H03G 3/3005;
H03G 3/001; H03G 3/301; H03G 3/32;
H04M 1/0202
USPC .................................................. 381/120, 121
See application file for complete search history.

(56) References Cited

U.S. PATENT DOCUMENTS

| | | | |
|---|---|---|---|
| 2010/0277240 A1 | 11/2010 | Qui et al. | |
| 2013/0156207 A1* | 6/2013 | Visser ................ | H04M 1/0206 381/57 |
| 2013/0214857 A1* | 8/2013 | Qiu ..................... | H03G 3/3052 330/98 |
| 2016/0036472 A1* | 2/2016 | Chang ................. | H04B 1/0475 375/297 |
| 2016/0126968 A1* | 5/2016 | Lesso ................... | H03M 1/18 341/155 |

OTHER PUBLICATIONS

International Search Report and Written Opinion of the International Searching Authority, International Application No. PCT/GB2018/051441, dated Aug. 28, 2018.

* cited by examiner

ANALOGUE SIGNAL PATHS

FIELD OF DISCLOSURE

This application relates to methods and apparatus for providing feedback from an analogue signal, in particular an analogue audio signal.

BACKGROUND

Many electronic devices include some audio functionality, for instance for media playback or voice communication and/or voice control. Increasing audio data may be stored in a digital format and audio signals may be transmitted and processed as digital signals, however there are still a number of functions that may commonly use analogue audio signals. For instance analogue audio signals may be used to drive audio output transducers, e.g. loudspeakers.

Many electronic devices may thus include an audio signal path that receives an input digital audio signal and which converts the digital audio signal to an analogue audio signal. The analogue audio signal may be processed and may be propagated along an analogue part of the signal path, for instance to an audio load such as a loudspeaker. For example, an analogue audio driving signal may be supplied to an audio load of the host device or output to an external peripheral device, which may be removably connected to the host device via suitable connectors, e.g. a plug and socket. The external device could be a peripheral device such as a headset with relatively small loudspeakers, e.g. located in earphones or earbuds or the like. Such headset loudspeakers will typically have a relatively low impedance, say of the order of a few ohms or so.

There is a trend for increasing the audio performance from electronic devices, especially portable electronic devices. However for such devices size and power consumption are also deemed to be important considerations and reducing the size and power may often conflict with increasing audio performance.

For example, considering distortion, various factors may contribute to distortion in an audio signal path such as a signal path for an amplifier circuit driving a load. Typically the distortion is worst for lower impedance loads. An amplifier may be designed to maintain adequately low distortion into a low impedance load by increasing the output stage quiescent current, generally requiring larger output driving devices and higher current pre-driver stages. Distortion may also be managed by designing the amplifier circuitry with multiple amplifier stages to attempt to suppress output distortion by a high open-loop amplifier gain. However these approaches generally increase both the power consumption of the amplifier circuitry and the size and complexity, and hence cost, of the circuitry.

SUMMARY

Embodiments of the present disclosure relate to methods and apparatus for audio signal paths that mitigate at least of the above mentioned issues.

Thus according to the present invention there is provided an audio circuit comprising:
  a forward signal path with an input for an input digital audio signal and an output for an output analogue audio signal;
  a feedback path comprising an analogue-to-digital conversion module for receiving an analogue feedback signal derived from the output analogue audio signal and outputting a corresponding digital feedback signal;
  wherein the analogue-to-digital conversion module comprises an analogue-to-digital converter (ADC); an analogue gain element configured to apply analogue gain to the analogue feedback signal before the ADC; and a digital gain element for applying digital gain to a signal output from the ADC; and
  a gain controller for controlling the analogue gain and the digital gain applied based on the input digital audio signal.

The analogue gain element may be a variable analogue gain element. The digital gain element may be a variable digital gain element. The gain controller may selectively control the analogue gain of the variable analogue gain element and the digital gain of the variable digital gain element. The gain controller may be configured to control the analogue gain and the digital gain such that digital gain at least partly reverses the analogue gain applied by the analogue gain element.

In some embodiments the analogue gain element and the digital gain element are located in a first ADC path and the analogue-to-digital conversion module comprises at least one further ADC path. The, or each, further ADC path is also configured to receive the analogue feedback signal, and each further ADC path comprises an ADC and is configured to apply different amounts of analogue gain and digital gain. The gain controller may select the ADC paths that contribute to the digital feedback signal. In such an embodiment one further ADC path may be configured such that the analogue feedback signal is supplied to the ADC for that ADC path without any analogue gain applied.

The gain controller may control the analogue gain to apply a relatively higher analogue gain for relatively lower magnitudes of the input digital audio signal.

In some embodiments the gain controller is configured to receive a version of the input digital audio signal. The gain controller may comprise an envelope detector configured to receive a version of the input digital audio signal and determine an envelope value for the input digital audio signal. The gain controller may be configured to receive the version of the input digital audio signal which is tapped from the forward signal path upstream of a digital module that has an associated digital propagation delay. In some implementations the digital module may comprise an upsampling module.

In some embodiments the gain controller is configured to receive an envelope signal indicative of an envelope value for the input digital audio signal.

In some implementations the forward signal path may comprise a digital variable gain module for applying a variable digital gain to the forward signal path. In such case the gain controller may be configured to receive an indication of the variable digital gain applied to the forward signal path. Where the gain controller comprises an envelope detector, the envelope detector may be configured to modify the envelope value based on the indication of the variable digital gain applied to the forward signal path.

In some implementations the circuit may have a digital-to-analogue converter (DAC) in the forward signal path. There may be an analogue amplifier in the forward signal path downstream of the DAC. The analogue amplifier may be operable to provide a variable amplification gain. In which case the gain controller may be configured to receive an indication of the amplification gain and to control the analogue gain and the digital gain applied by the analogue-to-digital conversion module also based on the amplification gain.

In some implementations there may be a class-D amplifier in the forward signal path. The analogue feedback signal may be derived from downstream of a filter coupled to the class-D amplifier. In some embodiments the audio circuit may be configured to drive a bridge-tied load.

In some embodiments the forward signal path may be a first forward signal path and the audio circuit may further comprise a second forward signal path that extends between a branch node of the first signal path and a second output for an output analogue audio signal. The second forward signal path may comprise a digital inverter for inverting a digital signal tapped from the branch node of the first signal path.

In some embodiments the feedback path may be a first feedback path for receiving the analogue feedback signal derived from the output analogue audio signal at the output of the first forward signal path and for outputting a corresponding digital feedback signal for processing in the first forward signal path downstream of the branch node. In such a case the audio circuit may further comprise a second feedback path comprising a second analogue-to-digital conversion module for receiving a second analogue feedback signal derived from the output analogue audio signal at the output of the second forward signal path and outputting a corresponding digital feedback signal for processing in the second forward signal path. The second analogue-to-digital conversion module may comprise a second analogue-to-digital converter (ADC); a second analogue gain element configured to apply analogue gain to the second analogue feedback signal before the second ADC; and a second digital gain element for applying digital gain to a signal output from the second ADC. The gain controller may configured to control the analogue gains and the digital gains applied by analogue-to-digital conversion modules of both the first and second feedback paths based on the input digital audio signal.

Alternatively in some embodiments the analogue-to-digital conversion module of the feedback path may be configured to receive the analogue feedback signal derived from the output analogue audio signal at the output of the first forward signal path and also a second analogue feedback signal derived from the output analogue audio signal at the output of the second forward signal path and the audio circuit may be configured to modulate the first forward signal path upstream of the branch node based on said digital feedback signal.

The audio circuit may comprise a first processing module for processing the signal in the forward signal path based at least partly on the digital feedback signal. The first processing module may comprise a pre-distortion module for applying a first transfer function to the signal in the forward signal path so as to at least partly compensate for distortion inherent in the forward signal path. The first processing module may alternatively be configured to determine an error between the input signal and the digital feedback signal and process the signal in the forward signal path based at least partly on the determined error. The first processing module may be configured to integrate the determined error and subtract the integrated error from the signal in the forward signal path. In some embodiments the first processing module may be configured to combine the signal in the forward signal path with the digital feedback signal and filter the combined signal in the forward signal path.

In some examples the gain controller may be further configured to control a bias applied to the ADC based on the input digital audio signal.

The audio circuit may be implemented as an integrated circuit.

Embodiments also relate to audio apparatus comprising an audio circuit according to any of the variants discussed above. In such an apparatus the output of the audio circuit may be coupled to an output audio path that comprises at least one non-linear component wherein said analogue feedback signal is derived from the output audio path downstream of the at least one non-linear component. The apparatus may further comprise a first connector for removably connecting to a mating second connector of a peripheral device wherein the apparatus is operable, in use, to supply the output analogue audio signal to the first connector for driving an audio transducer of a connected peripheral device. The audio apparatus may comprise at least one of: a battery powered device; a portable device; a communications device; a mobile telephone; a smartphone; a computing device; a laptop; notebook or tablet computer; a gaming device; a personal media player; a wearable device; a voice controlled device.

In another aspect there is provided an audio circuit comprising:
  a forward signal path having an input node for receiving an input digital audio signal;
  a signal processing module for the processing the input digital audio signal;
  a feedback node for receiving an analogue feedback signal derived from the input digital audio signal;
  an analogue gain element configured to receive the analogue feedback signal and apply a controlled analogue gain;
  an analogue-to-digital converter (ADC) configured to receive the output of the analogue gain element;
  a digital gain element configured to receive an output of the ADC and apply a controlled digital gain; and
  a gain controller configured to receive a version of input digital audio signal and control the analogue gain and the digital gain based on the input digital audio signal.

In a further aspect there is provided an audio circuit comprising:
  a forward signal path for receiving an input digital audio signal and outputting an output analogue audio signal;
  a feedback path for receiving an analogue feedback signal derived from the output analogue audio signal; and
  a gain controller for controlling an analogue gain and a digital gain applied before and after an analogue-to-digital converter (ADC) in the feedback path based on the input digital audio signal.

In a further aspect there is provided an audio circuit comprising:
  a forward signal path with an input for an input digital audio signal and an output for an output analogue audio signal;
  a feedback path comprising an analogue-to-digital conversion module for receiving an analogue feedback signal derived from the output analogue audio signal and outputting a corresponding digital feedback signal;
  wherein the analogue-to-digital conversion module comprises an analogue-to-digital converter (ADC); an analogue gain element configured to apply analogue gain to the analogue feedback signal before the ADC; and a digital gain element for applying digital gain to a signal output from the ADC; and a gain controller for controlling the analogue gain and the digital gain applied.

The gain controller may be configured to control the analogue gain and the digital gain applied based on an indication of the level of the input digital audio signal. The indication of the level of the input digital audio signal may comprise an indication of a digital gain applied in the forward signal path. In some implementations the ADC, analogue gain element and digital gain element are located in a first ADC path and the analogue-to-digital conversion module comprises at least one further ADC path configured to receive the analogue feedback signal. Each further ADC path may comprise an ADC and be configured to apply different amounts of analogue gain and digital gain. The gain controller may select the ADC paths that contribute to the digital feedback signal.

BRIEF DESCRIPTION OF THE DRAWINGS

Embodiments will now be described by way of example only with reference to the accompanying drawings, of which.

DETAILED DESCRIPTION

Embodiments of the invention provide audio circuitry and methods of audio processing. Embodiments provide audio circuits with good audio performance, e.g. in terms of distortion, noise etc. Audio circuits according to embodiments of the disclosure may be relatively small in circuit area and/or have relatively low power requirements compared to conventional audio circuitry of similar performance.

Figure 1:
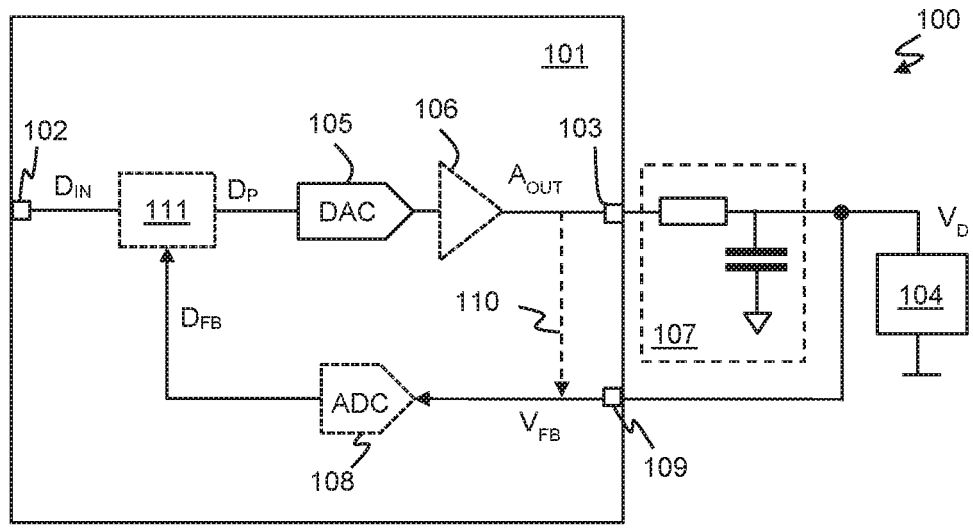
FIG. 1 illustrates an example audio signal path.

FIG. 1 illustrates one example of a generalised audio circuit arrangement 100. An audio circuit 101 has an input node 102 for receiving an audio signal and an output node 103 for outputting an audio signal for a downstream audio component 104. The downstream component 104 is a component that operates with analogue audio signal. As mentioned above however, audio is increasing being stored and transmitted in digital format as far as possible and thus the input signal received at the input node 102 is a digital audio signal $D_{IN}$. The audio circuit 101 thus comprises a digital-to-analogue converter (DAC) 105 in the forward signal path between the input node 102 and the output node 103 and the audio circuit outputs an analogue audio signal $A_{OUT}$ at the output node.

One example of such an audio circuit arrangement 100 comprises an audio driving circuit for driving an audio load. Thus the audio circuit 101 may be at least part of an audio driving circuit such as a codec or the like and the audio component 104 may comprise an audio load such as a loudspeaker. The audio load 104 may be part of the same host device as the audio driving circuit 101 or it may be an external load connected, in use, via some suitable connection (omitted from FIG. 1 for clarity). The audio circuit 101 may be an integrated circuit, in which case the output node 103 could comprise an output terminal, e.g. pin or pad, of the integrated circuit although in some instances the output node could be any suitable node of the signal path downstream of the DAC 105. Likewise the input node 102 could be a suitable pin of the audio circuit 101 or may just be a node of a signal path, for instance coupled to the output of some upstream processing block.

In this example the audio circuit 101 may thus convert the input digital audio signal $D_{IN}$ into an output analogue audio signal $A_{OUT}$ to be applied to the audio load 104 as a driving signal $V_D$. In some instances the DAC 105 may, itself, be able to output a suitable analogue output signal $A_{OUT}$. For example the DAC 105 could comprise a class-D amplifier or similar. In some instances however the audio circuit 101 may comprise an analogue amplifier 106 downstream of the DAC 105 to amplifier or buffer the output of the DAC 105 to produce the analogue output signal $A_{OUT}$.

In some instances there may be one or more analogue components 107 in the analogue part of the signal path between the output node 103 and the audio component, e.g. audio load, 104. Where the audio circuit 101 is formed as integrated circuit, e.g. a codec or the like, at least some analogue components 107 may be formed external to the integrated circuit 101. For instance, if the DAC 105 is a class-D amplifier the analogue components 107 could comprise filter components. Additionally or alternatively the analogue components may comprise components such as ferrite beads for EMI (electromagnetic interference) reduction for the off-chip signal path.

It will be appreciated by one skilled in the art that the output of a class-D amplifier or the like might be a rail-to-rail output PWM signal which is low-filtered by some downstream elements, which may include a load being driven by the class-D amplifier and/or some dedicated filter components. As used in this specification the term analogue signal will include the output of a class-D amplifier.

As noted above there is a general trend towards requiring high quality audio performance, i.e. to ensure that the audio driving signal $V_D$ supplied to the audio load meets certain performance criteria, e.g. in terms of fidelity, noise, dynamic range etc. However to achieve the required performance in an open-loop analogue signal path may require the use of analogue circuitry which is relatively large and/or has relatively high power consumption. For example amplifier 106 may be designed to maintain relatively low distortion through the use of relatively large output stage quiescent currents and/or using multiple amplifier stages with a high open-loop amplifier gain, but these approaches require relatively high power consumption and/or a relatively large circuit area for the amplifier. Generally it is desired to keep power and size requirements as low as possible.

One way to improve performance could be to use feedback. Feedback of the analogue audio signal, either the driving signal $V_D$ or the analogue output signal $A_{OUT}$, can provide useful information about the analogue audio signal, for instance the amount of distortion, noise etc. which may be used to increase performance, e.g. by adjusting parameters to optimise the audio performance and/or to compensate for errors introduced by the signal processing.

In general, for power and size reasons it is advantageous for audio circuit to comprise digital circuitry as far as possible. Thus an analogue-to-digital converter (ADC) 108 could be provided to receive an analogue feedback signal $V_{FB}$. The analogue feedback signal $V_{FB}$ could be tapped from the downstream signal path and received via a node, e.g. pin, 109, and thus be indicative of the driving signal $V_D$. Alternatively the analogue feedback signal $V_{FB}$ could be provided by an on-chip feedback path 110 and indicative of the analogue output signal $A_{OUT}$. The ADC 108 converts the analogue feedback signal $V_{FB}$ to a digital feedback signal $D_{FB}$ which can be supplied to a processing module 111. The processing module could adjust some aspect of the operation of the audio circuit 101 based on the digital feedback signal $D_{FB}$ so as to improve performance, compared to open-loop operation. For instance the processing module 111 could apply some processing to the input digital audio signal $D_{IN}$ to provide a processed version $D_P$ that may be compensated or corrected for the effects of the downstream components.

In theory such an arrangement could reduce the requirements on the components of the signal path, for instance size and/or power requirements of the DAC 105 and/or amplifier 106 if present, whilst allowing the audio circuit to meet certain performance criteria.

It will be understood that in such an analogue feedback arrangement the performance of the ADC 108 will be important. For example if the ADC 108 introduces noise into the digital feedback signal $D_{FB}$ then such noise may be introduced into the signal in the forward signal path. If the processing module 111 attempts to compensate for distortion in the analogue part of the signal path, the digital feedback signal $V_{FB}$ should be an accurate representation of the relevant analogue audio signal, e.g. $A_{OUT}$.

An ADC 108 implemented as illustrated in FIG. 1 would thus need to have good noise performance, better than that of the forward signal path, in order to provide a benefit. Conventionally this would require an ADC that would be relatively large and/or with relatively high power requirements. The requirements for the ADC may be such that there is no size or power benefit compared to implementing a higher specification amplifier.

In embodiments of the present disclosure an audio circuit has a forward signal path with an input for an input digital audio signal and an output for an output analogue audio signal and a feedback path comprising an analogue-to-digital conversion module for receiving an analogue feedback signal derived from the output analogue audio signal and outputting a corresponding digital feedback signal. The analogue-to-digital conversion module comprises an analogue-to-digital converter (ADC) with an analogue gain element, configured to apply analogue gain to the analogue feedback signal before the ADC, and a digital gain element for applying digital gain to a signal output from the ADC and a gain controller for controlling the analogue gain and the digital gain applied based on the input digital audio signal.

Figure 2:
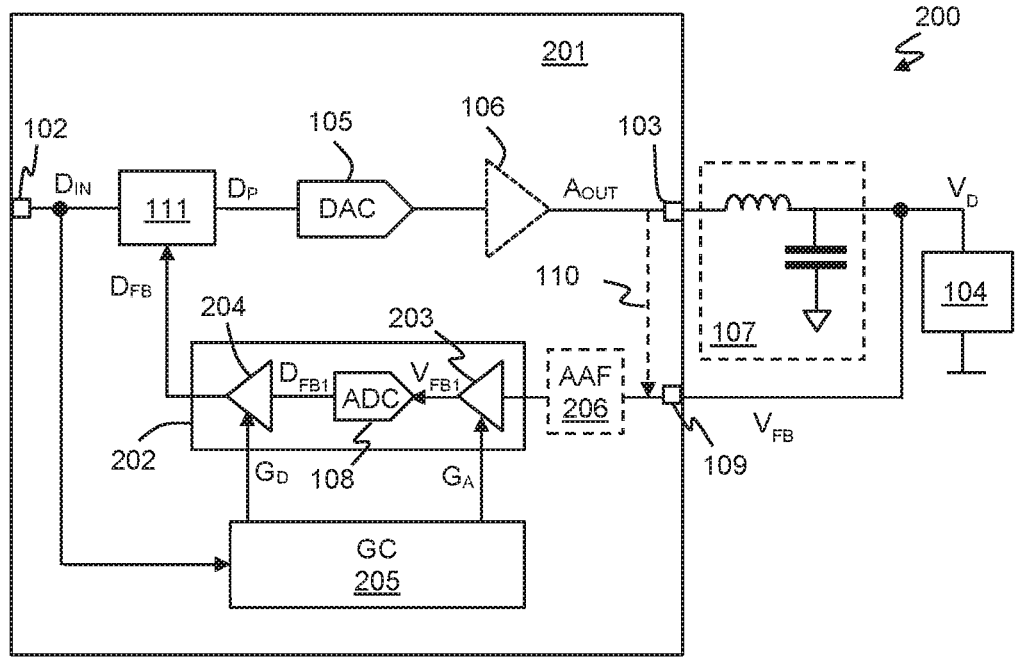
FIG. 2 illustrates an amplifier circuit arrangement according to an embodiment.

FIG. 2 illustrates one example of an audio circuit arrangement having an audio circuit 201 according to an embodiment, in which similar components to those discussed with respect to FIG. 1 are identified by the same reference numerals.

The audio circuit 201, which may be at least part of an integrated circuit, again has a forward signal path between input node 102 and output node 103, for receiving an input digital audio signal $D_{IN}$ and outputting an analogue audio signal $A_{OUT}$. As discussed previously the input node 102 may be an input terminal for the audio circuit 201, e.g. a circuit pin or the like, or may be a node of the circuit, e.g. some suitable part of a signal path of the integrated circuit, e.g. the output of a signal processing block. Likewise the output node 103 may be an output terminal, e.g. pin/pad, for the audio circuit 201, or may be a node of a signal path of the audio circuit. The forward signal path has a DAC 105 and may, in some embodiments comprise an amplifier 106 downstream of the DAC 105.

The output analogue audio signal $A_{OUT}$ may be output to any downstream analogue audio signal path. In the example illustrated in FIG. 2 the output analogue audio signal $A_{OUT}$ is propagated, in use, to a relevant audio load, e.g. audio transducer such as a loudspeaker, via a signal path that may include analogue components 107. As discussed above the audio load 104 may be a transducer of an external device connected, in use, via a connector (not shown), e.g. via a tip or ring contact of a jack socket for example.

The audio circuit 201 also comprise a feedback path for receiving a feedback signal $V_{FB}$ derived from the output analogue audio signal $A_{OUT}$. In the embodiment of FIG. 2 the feedback path includes an ADC 108. The ADC 108 forms part of an ADC module 202 which also includes an analogue gain element 203 for applying analogue gain $G_A$ to the analogue feedback signal $V_{FB}$ upstream of the ADC 108. The gain adjusted analogue feedback signal $V_{FB1}$ is thus supplied to the ADC 108. The ADC module 202 also includes a digital gain element 204 for applying digital gain $G_D$ to the digital signal $D_{FB1}$ produced by the ADC 108 to provide the digital feedback signal $D_{FB}$. A gain controller 205 is provided to control the gains applied by the ADC module 202. In some embodiments, an anti-aliasing filter 206 may be provided upstream of the ADC module 108 in the feedback path, although such a filter may not be needed if the analogue feedback signal $V_{FB}$ is tapped from the signal path downstream of elements 107 that provide some filtering.

In use the ADC module 202 is operable to vary the gains applied in the feedback path, i.e. the analogue gain $G_A$ and the digital gain $G_D$, in producing the digital feedback signal. The gain controller 205 controls the gains applied by the ADC module 202 based on the input digital signal $D_{IN}$.

In some embodiments the analogue gain element 203 and digital gain element 204 may each be variable gain elements so that the respective gain applied, $G_A$ or $G_D$, may be controllably varied in use. The gain controller 205 may thus controllably vary the analogue gain $G_A$ applied and the digital gain applied $G_D$ according to the digital input signal $D_{IN}$.

The analogue gain $G_A$ may be varied so as to provide more positive gain (i.e. a greater boost or reduced attenuation) at lower signal levels and less positive gain (i.e. a reduced boost or increased attenuation) at higher signal levels. The digital gain $G_D$ may be varied in a converse fashion, i.e. to provide less positive gain at lower signal levels and more less positive gain at higher signal levels. The variation of the digital gain $G_D$ may thus compensate, at least partly, for the variation of the analogue gain $G_A$. In some embodiments the digital gain $G_D$ may be varied inversely to the analogue gain so that $G_A * G_D$ is substantially constant and provides a desired level of overall gain for the feedback path.

As described above the analogue feedback signal $V_{FB}$ is derived from the analogue audio signal $A_{OUT}$ which is output from the audio circuit 201. This analogue audio signal $A_{OUT}$ is produced based on the received digital audio signal $D_{IN}$. Thus it will be clear that the digital input signal $D_{IN}$ is indicative of the analogue feedback signal $V_{FB}$, and in particular the signal level of the voltage feedback signal $V_{FB}$ and how it changes can be determined from the input signal $D_{IN}$. This allows the analogue gain $G_A$ applied to the analogue feedback signal $V_{FB}$ to be set appropriately so as to maximise the use of some operating range of the ADC 108.

Thus, when the input digital audio signal $D_{IN}$ indicates that the level, e.g. envelope, of the analogue feedback signal $V_{FB}$ will be high, the analogue gain $G_A$ may be set relatively low. For example if the input digital audio signal $D_{IN}$ indicates that the analogue feedback signal is at or near maximum amplitude, the analogue gain $G_A$ may be controlled to a minimum gain setting, i.e. applying lowest boost or greatest attenuation, which allows the gain adjusted feedback signal $V_{FB1}$ to be converted to digital by the ADC 108 without clipping and making use of substantially all of the relevant operating input range of the ADC 108. If the input digital audio signal $D_{IN}$ indicates that the amplitude of the analogue feedback signal $V_{FB}$ reduces, the analogue gain $G_A$ may then be increased so that the gain adjusted feedback signal $V_{FB1}$ make use of more of the relevant operating range of the ADC 108 than otherwise would be the case. The analogue gain $G_A$ may be controlled so that the gain adjusted feedback signal $V_{FB1}$ makes use of most or substantially all of the relevant operating range of the ADC 108. The digital gain varies in the converse sense so that increased analogue gain applied is offset by a reduced digital gain.

The gain controller 205 may thus control the analogue and digital gain elements 203 to 204 to apply the techniques of dynamic range extension (DRE) to the ADC 108. This provides the advantage of improving the signal-to-noise ratio (SNR) for the digital feedback signal $D_{FB}$. It will be understood that the ADC 108 will quantify the input analogue voltage level to one of a defined number of digital values and thus, will introduce quantisation noise into the digital output. The quantisation noise depends on the voltage resolution of the ADC 108, which is fixed. By effectively applying an increased analogue gain $G_A$ for lower level input signals, together with a corresponding reduced digital gain, the same signal level in the digital feedback signal $D_{IN}$ is produced as if the gain adjustments were not made, but the quantisation noise is effectively attenuated. As mention this improves SNR, at least for lower level signals.

DRE is a known technique, but conventionally DRE techniques for an ADC are implemented with the gains being controlled based on the signals of the signal path in which the ADC itself is located. Thus conventional DRE would control the gains based on an analogue signal supplied to the ADC, possibly after gain adjustment, e.g. by comparing the analogue signal to one or more thresholds. This would however increase the amount of analogue circuitry required. In some instances it may be possible to control the DRE gains applied either side of an ADC based on the digital output from the ADC. However it will be understood that the analogue gain should be set at an appropriate level for the analogue signal input to the analogue gain element. If a relatively high analogue gain was being applied, suitable for a low level analogue signal, it would be necessary to reduce the analogue gain before the analogue signal increases significantly so as to prevent the gain adjusted analogue signal exceeding the input range of the ADC. If the ADC has a relatively long latency associated with conversion, as may be the case with some ADCs, then the digital output from the ADC may lag the input analogue signal by some amount. This may make it difficult to control the analogue and digital gains appropriately, without taking a cautious approach as to the amount of analogue gain that can be applied and thus limiting the possible performance benefits.

In embodiments of the present disclosure the gain applied by the ADC module 202 is controlled based on a digital signal applied to a different signal path. In this particular application it is known that the digital audio signal $D_{IN}$ applied to the forward signal path can be used as a suitable look-ahead for the level of the analogue feedback signal $V_{FB}$. This allows the analogue and digital gains $G_A$ and $G_D$ to be controlled appropriately.

Embodiments of the present disclosure thus allow DRE type techniques to be applied with gain control implemented as wholly digital circuitry, which thus can be implemented by relatively small and/or low power circuitry, but without the latency problems associated with the digital feedback signal $D_{FB}$.

The use of an ADC module 202 with controlled analogue and digital gains $G_A$ and $G_D$ reduces the requirements on ADC 108 to meet a certain performance standard. In other words an ADC 108 may be implemented as a relatively small and/or low power ADC and control of the analogue and digital gains $G_A$ and $G_D$ can ensure that the noise in digital feedback signal $D_{FB}$ is relatively low (and the noise of the ADC 108 is reduced compared to no gain variation). The SNR of the digital feedback signal $D_{FB}$ can thus be good enough such that processing module 111 can use the digital feedback signal $D_{FB}$ to provide performance improvements for the forward signal path.

Figure 3:
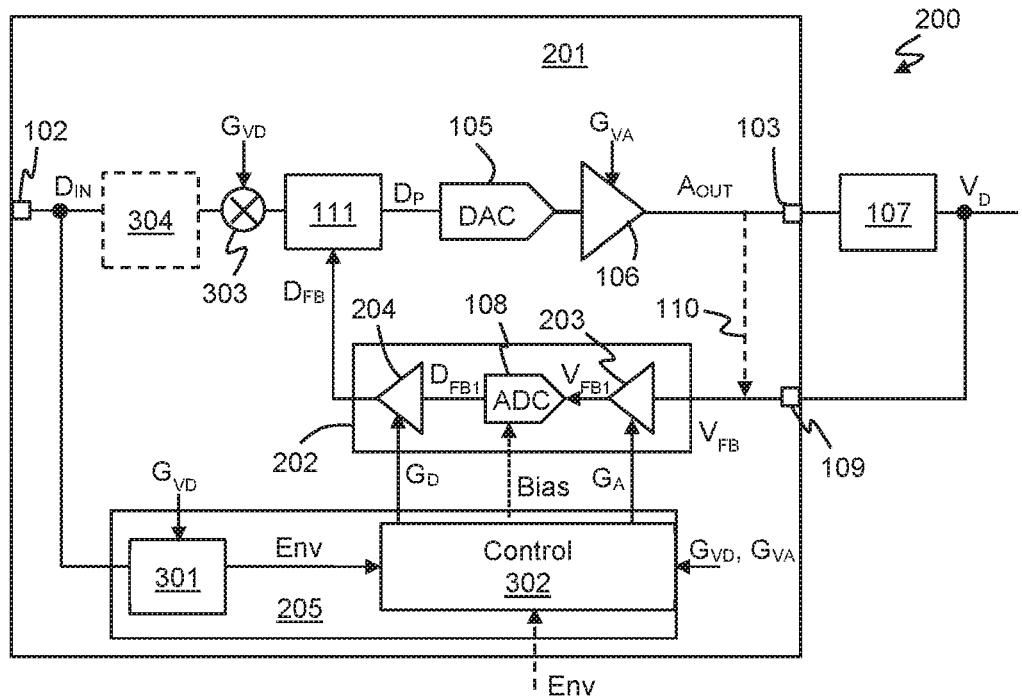
FIG. 3 illustrates an amplifier circuit arrangement according to a further embodiment.

As mentioned the gain controller 205 controls the gains applied by the ADC module 202 based on the digital audio signal $D_{IN}$ and in particular on the signal level of the digital audio signal $D_{IN}$. The gain controller 205 may thus receive a version of the digital audio signal $D_{IN}$ and determine the analogue and digital gains $G_A$ and $G_D$ based on the level of the digital audio signal $D_{IN}$. In some embodiments the gain controller 205 may comprise an envelope detector as illustrated in FIG. 3. An envelope detector 301 of the gain controller may thus be arranged to receive the digital audio signal $D_{IN}$ and determine an envelope value Env for the digital audio signal $D_{IN}$. There are various ways in which a digital envelope detector may determine an envelope value as would be understood by one skilled in the art. As used herein the term envelope detector will refer to any processing that determines an indication of the signal amplitude level. The envelope detector 301 may have a relatively fast attack time constant to respond quickly to any increases in signal level. The envelope value Env may be provided to control logic 302 of the gain controller 205 to set the analogue and digital gains $G_A$ and $G_D$ appropriately. Note that the envelope detector 301 could be separate from the control logic 302 and together just provide the functionality of the gain controller 205.

In some embodiments a suitable envelope detector could be off-chip. For instance in some implementations there may be an envelope detector arranged to determine an envelope value for the digital audio signal $D_{IN}$ upstream of the input node 102. In which case the gain controller 205 may be configured to receive the envelope value Env from the upstream envelope detector. In some embodiments the envelope value received may be quantised to some degree and may for instance just be an indication of whether the signal level is above or below some threshold, i.e. the envelope value may be an output from a low-level detector.

A version of the digital audio signal $D_{IN}$ may thus be tapped from the forward signal path (or in some cases upstream of the input node) and supplied to the gain controller 205. In some instance there may be some variable digital gain $G_{VD}$ that may be applied in the forward signal path, downstream of the tap point. For example for an audio driving circuit there may be a user controlled volume setting which is applied as a variable digital gain $G_{VD}$, for example by digital multiplier 303. If the signal supplied to the envelope detector 301 is tapped from upstream of such variable digital gain $G_{VD}$, the effect of the variable digital gain $G_{VD}$ should be taken into account in setting an appropriate analogue gain $G_A$ for the feedback path. The envelope detector 301 and/or the control logic 302 of the gain controller 205 may thus be provided with the value of the variable digital gain $G_{VD}$ applied.

In some embodiments the gain controller 205 could be configured to control the analogue and digital gains $G_A$ and $G_D$ applied in the feedback path based on the value of the variable digital gain $G_{VD}$ applied, without determining the envelope or signal level of the actual digital audio signal $D_{IN}$. In other words the variable digital gain $G_{VD}$ applied, e.g. the user or system controlled volume setting, may be used as an indication of the signal level of the digital audio signal $D_{IN}$ and hence the analogue feedback signal $V_{FB}$. The variable digital gain $G_{VD}$ applied can be used as an indication of the maximum expected signal level and the analogue and digital gains $G_A$ and $G_D$ controlled accordingly. This would avoid the need to determine the envelope of the digital audio signal $D_{IN}$ but would not provide the same benefits for low level parts of the signal, and thus controlling the analogue and digital gains $G_A$ and $G_D$ applied in the feedback path based on the actual digital signal itself, e.g. an envelope value, may be advantageous in some implementations.

In some instances a gain of an analogue component of the forward signal path may also be variable, for instance the may be a variable analogue gain $G_{VA}$ applied by amplifier 106, i.e. an amplification gain. The gain controller 205 may also be provided with an indication of the variable analogue gain $G_{VA}$ applied in the forward signal path so that the analogue gain $G_A$ of the feedback path can be set correctly to maximise the used operating range of the ADC 108 whilst avoiding signal clipping, and also to set the analogue and digital gains $G_A$ and $G_D$ to compensate for any variable analogue gain $G_{VA}$ in the forward signal path.

In some embodiments the input digital audio signal $D_{IN}$ may be subjected to some digital processing in the forward signal path before being converted to analogue. Thus there may be a signal processing module 304 in the forward signal path. For example the digital audio signal $D_{IN}$ may be up-sampled prior to being converted to analogue by processing module 304. Such processing may introduce an inherent propagation delay into the forward signal path. In some embodiments the digital signal supplied to the gain controller 205 may be tapped from upstream of the processing module 304. The processing module 304 effectively acts as a delay element, thus providing the gain controller 205 with a greater amount of look-ahead for signal changes in the analogue feedback signal $V_{FB}$. This allows sufficient time for the envelope detector 301, if present, to determine the envelope value Env, and the control logic 302 to determine and set appropriate gain settings. In some embodiments if there was no such signal processing and/or a greater propagation delay was desired for the forward signal path the module 304 could comprise a digital delay element and thus the processing module may be any component(s) that provides a digital propagation delay.

In some embodiments one or more other parameters of the feedback path may be controlled based on the indication of the level of the input digital audio signal DN. For instance a bias supplied to the ADC 108 in the feedback path may be varied by the gain controller 205 based on the digital audio signal $D_{IN}$, e.g. the envelope value Env. As one skilled in the art will appreciate a bias voltage and/or current may be supplied to the ADC 108. The performance of the ADC 108 may partly depend on the bias supplied, for instance the noise performance may be better at higher bias levels, but at the expense of increased power consumption. The bias may thus be varied based on the signal level, for instance it may be increased for lower signal levels to improve SNR but reduced at higher signal levels where the higher signal itself will provide adequate SNR.

As discussed above the ADC module 202 may comprise an analogue gain element 203 that is operable to provide a variable analogue gain $G_A$ and a digital gain element that is operable to provide a variable digital gain $G_D$. In some embodiments however the ADC module 202 may comprise a plurality of ADC paths operable to receive the analogue feedback signal $V_{FB}$. The gain controller 205 may control the gain applied by the ADC module 202 by selecting an appropriate ADC path as the one used to generate the digital feedback signal.

Figure 4:
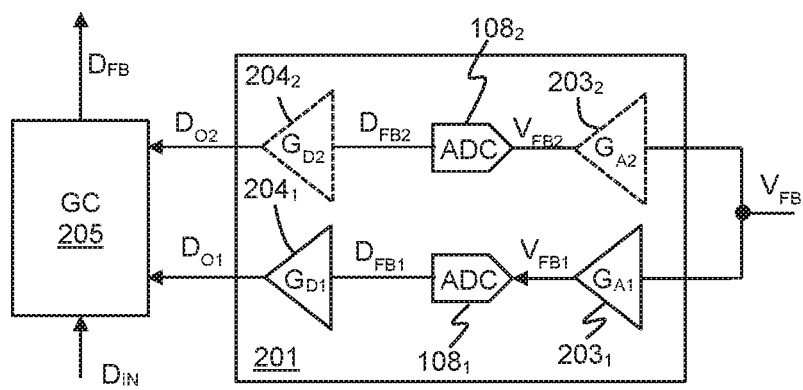
FIG. 4 illustrates an example of an analogue-to-digital conversion module.

FIG. 4 illustrates an embodiment where the ADC module 202 comprise a first ADC path with a first analogue gain $G_{A1}$ and a second ADC path with a second different analogue gain $G_{A2}$. FIG. 4 illustrates that the analogue feedback signal $V_{FB}$ may be divided into the two separate ADC paths. The first ADC path has an analogue gain element $203_1$ for applying a defined first analogue gain $G_{A1}$. The defined first analogue gain may be a fixed gain and may be non-unity. In this embodiment the first ADC path also has a first ADC $108_1$ and a first digital gain element $204_1$ for applying a first digital gain $G_{D1}$. The first digital gain $G_{D1}$ may be fixed and may be defined so as to provide a desired overall gain $G_{A1}*G_{D1}$. The first ADC path may provide a first digital output $D_{O1}$. The first and second ADCs $108_1$ and $108_2$ may be of substantially identical design. The second ADC path is configured to apply different analogue and digital gains $G_{A2}$ and $G_{D2}$. There may thus be a second analogue gain element $203_2$ for applying a fixed analogue gain $G_{A2}$ and a second digital gain element $204_2$ for applying a second fixed digital gain $G_{D2}$. The second analogue and digital gains $G_{A2}$ and $G_{D2}$ are different to the first analogue and digital gains $G_{A1}$ and $G_{D1}$ but may be arranged to provide the same overall gain, i.e. $G_{A1}*G_{D1}=G_{A2}*G_{D2}$. The second ADC path may provide a second digital output $D_{O2}$.

In at least some embodiments at least one of the second analogue gain element $203_2$ or second digital gain element $G_{D2}$ may be omitted. If the overall gain of the first signal path $G_{A1}*G_{D1}$ is equal to unity then both the second analogue and digital gain elements may be omitted and the second signal ADC may comprise a second ADC $108_2$ without additional gain elements.

The gain controller 205 may be configured to select an appropriate one of the first or second ADC paths to be used for generating the digital feedback signal $D_{FB}$. For instance consider that the second ADC path comprises the second ADC $108_2$ only, i.e. there is no second analogue gain element $203_2$ or second digital gain element $204_2$ and thus $G_{A2}=G_{D2}=1$. The first ADC path has first analogue gain element $203_1$ to apply a gain boost and second digital gain element $204_1$ to apply a corresponding attenuation. For low-level signals the first ADC path will provide a boost to the analogue feedback signal and the first output $D_{O1}$ may provide a suitable output signal with lower noise/improved SNR to the first output $D_{O2}$. The first output $D_{O1}$ may thus be selected to provide the digital feedback signal $D_{FB}$. For higher level signals the boost applied for the first analogue gain element $203_1$ may cause clipping in the first ADC $108_1$. However the signal in the second ADC path will be converted satisfactorily without clipping. The gain controller 205 may thus select the second output $D_{O2}$ to be used as the digital feedback signal $D_{FB}$. By selecting either the first ADC path or the second ADC path of the ADC module 202 to be used to provide the digital feedback signal $D_{FB}$ the gain controller thus selectively varies the gains applied by the ADC Module to generate the feedback signal $D_{FB}$.

The gain controller 205 may receive an indication of the digital audio signal $D_{IN}$. This can provide a look-ahead for the gain controller 205 as to what changes are expected for the analogue feedback signal $V_{FB}$. This can allow the gain controller 205 to switch between the various outputs $D_{O1}$ and $D_{O2}$ in a way that minimises any unwanted transients or errors in the feedback signals. For instance the gain controller can be provided with advance warning that a change in output, i.e. from $D_{O1}$ to $D_{O2}$ or vice versa, should occur and may be able to time the change to a zero crossing in the feedback signal. Additionally or alternatively there may be some element of cross-fading applied.

In some instances a look-ahead of the analogue feedback signal $V_{FB}$ may not be required and the gain controller 205 could transition from one output to another depending on whether the ADC path for high-level signals is above or below one or more thresholds. Given that there is no need to change the analogue gain applied in any ADC path, and an ADC path which is suitable for high-level signals is always present, the latency requirements are reduced compared to an arrangement with a variable analogue gain. In such a case the digital signal(s) output from the ADC module 202 may be used to select the appropriate gain applied. However in general it may be advantageous to use the digital input signal to swap between the various digital outputs at appropriate times.

The embodiment of FIG. 4 thus avoids the need to vary an analogue gain applied in the analogue part of a feedback path, which could introduce audio artefacts. However each different combination of analogue gain $G_A$ and digital gain $G_D$ is implemented as a separate ADC signal path of the ADC module 202. The number of different gain combinations that can be implemented without requiring a significant amount of additional circuitry is thus relatively limited.

Embodiments of the present disclosure thus provide a digital feedback signal $D_{FB}$ derived from an analogue audio signal $A_{OUT}$ that can have relatively low noise/good SNR whilst being produced by relatively small and/or low power components.

Such a feedback signal $D_{FB}$ can be provided to the processing module 111 and used to improve the performance of the forward signal path in a number of ways.

Figure 5A:
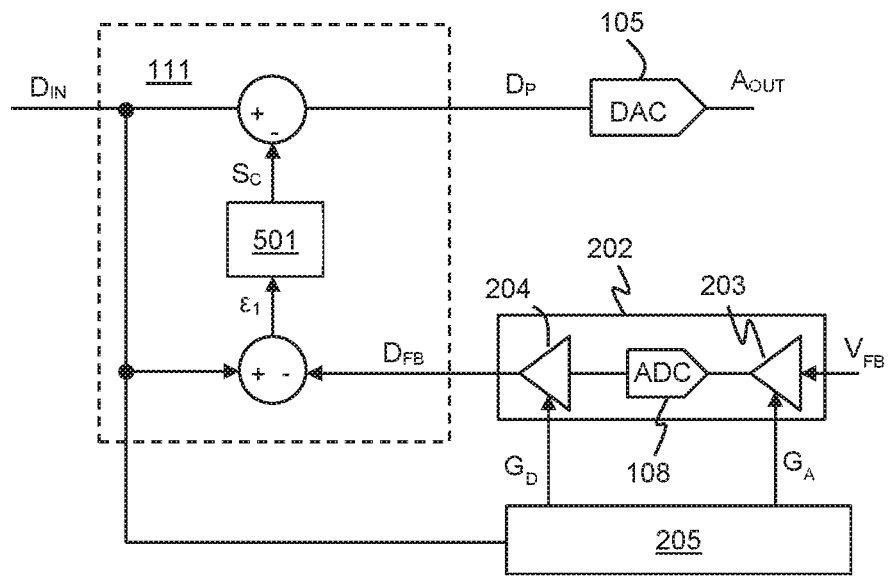
FIGS. 5a and 5b illustrate examples of processing modules for processing a digital audio signal based on a digital feedback signal.

FIG. 5a illustrates one example of a processing module 111 that may receive the digital feedback signal $D_{FB}$ and use the digital feedback signal to apply correction or compensation to the digital audio signal $D_{IN}$. In the example of FIG. 5a the processing module subtracts the feedback signal $D_{FB}$ from a version of the digital audio signal $D_{IN}$ to provide a first error signal $\varepsilon_1$. This first error signal $\varepsilon_1$ may be input to a functional module 501 which applies a defined function such as integration to generate a compensation signal $S_C$ that can be subtracted from the input digital audio signal $D_{IN}$ to compensate or correct for downstream errors. The resultant processed signal $D_P$ may be passed to the DAC 105.

Figure 5B:
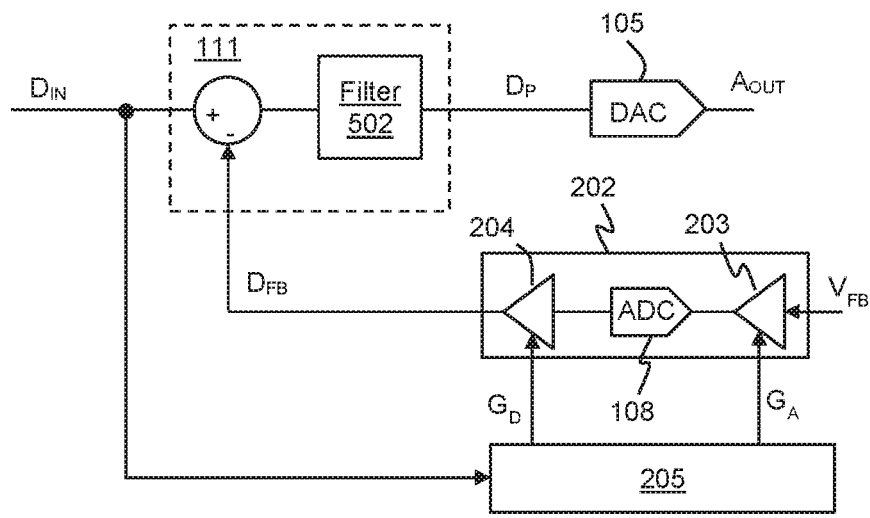

FIG. 5b illustrates another example of processing module 111. In this example the digital feedback signal $D_{FB}$ is subtracted from the input digital audio signal $D_{IN}$ and the resultant error signal is filtered by loop filter 502.

It will be appreciated however that these are just two examples of processing modules and the feedback signal $D_{FB}$ may be used in a variety of ways in different applications.

Figure 6A:
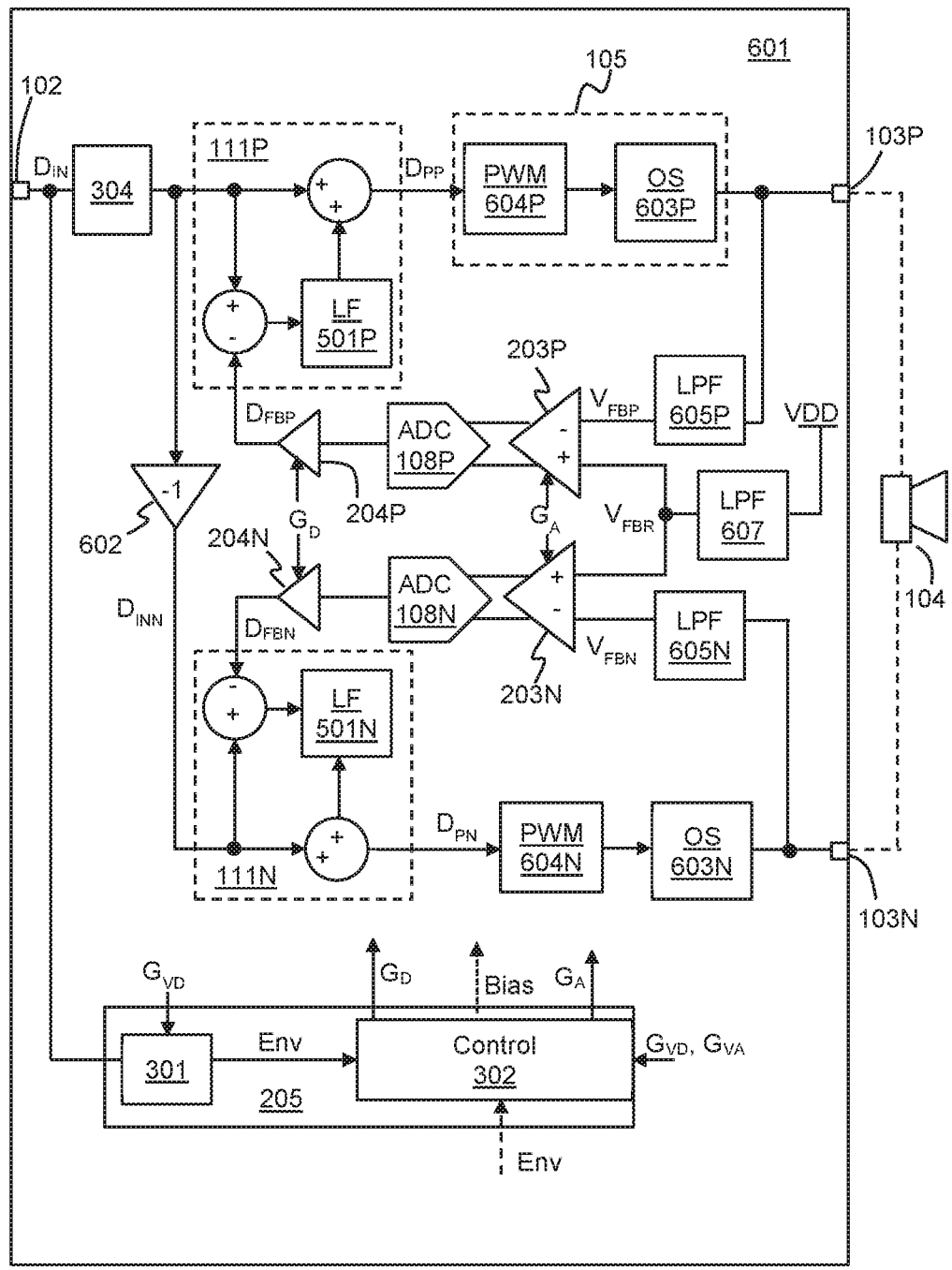
FIGS. 6a and 6b illustrate example of amplifier circuits for output of differential output signals according to further embodiments.

It will be appreciated that the embodiments described above have been described with reference to a single-ended load with a return to ground. It will of course be appreciated that the output could be an H-bridge type arrangement. The principles of operation would be the same as described. FIG. 6a illustrates one example of an audio circuit 601 according to an embodiment for outputting a differential output signal, for example for driving a bridge tied load. The audio circuit 601 thus has first and second output nodes 103P and 103N for outputting a differential output signal suitable for driving a load 104, electrically connected in use as a bridge tied load. In the example of FIG. 6a the audio circuit is operable with a digital input signal $D_{IN}$. The circuit has a first forward signal path between the input node 102 and the first output node 103P. In the embodiment of FIG. 6a a second forward signal path branches off from a branch node of the first forward signal path and extends to a second output node 103P.

Note as used herein, where similar components appear in both the first and second forward signal paths, or associated feedback paths, the components may be identified with the same basic reference numeral, which may in some instances correspond to a reference numeral used previous to describe a similar components in another embodiment, but with a suffix P or N as appropriate to denote the first or second processing paths. The reference numeral may be used without the suffix to refer to such components collectively, or singularly, where appropriate.

In the example of FIG. 6a the second forward signal path comprises a digital inverter 602 for inverting the digital input signal $D_{IN}$ to provide a complementary signal $D_{INN}$ to be processed in the second forward signal path.

The audio circuit 601 illustrated in the example of FIG. 6a is a class-D driver circuit. Each of the first and second forward signal paths thus comprises a respective class-D output stage 603P and 603N driven respectively by a suitable modulator 604P and 604N. In this example the modulators 604 are PWM (pulse-width-modulation) modulators. Together the PWM modulator 604 and output stage 603 of a signal path can be seen as providing the functionality of the ADC 108 as discussed previously, although it will be understood that the output from the Class-D output stages 603 will be filtered by an off-chip filter arrangement, which may include the load 104 itself, to provide a driving signal for driving the load 104.

In this example each of the first and second forward signal paths has a separate feedback path for providing feedback from the output of the first and second output stages 603P and 603N respectively. In the example illustrated in FIG. 6a the feedback signals may be derived from on-chip as shown, and thus first and second low-pass filters 605P and 605N may be arranged to filter the tapped feedback signals to provide first and second voltage feedback signals $V_{FBP}$ and $V_{FBN}$. In other embodiments however the feedback signals could be tapped from off-chip as discussed previously.

The analogue feedback signals $V_{FBP}$ and $V_{FBN}$ are provided to first and second analogue gain elements 203P and 203N, which in this example are programmable gain amplifiers (PGAs). In the embodiment of FIG. 6a the PGAs 203P and 203P each also receive a common reference voltage $V_{FBR}$ comprising a supply voltage VDD filtered by a low-pass filter 607. This can be advantageous to decouple the feedback from a supply, perhaps less well regulated, used for the power stage. This can allow the output stage 603 to provide a high voltage output, which may be boosted at times, whilst the feedback path may be relatively low voltage.

In variations of this embodiment the common reference voltage $V_{FBR}$ may be a scaled version of a supply voltage VDD, for example VDD/2, and VDD may be substantially equal to the output stage supply voltage.

The output of the PGAs 203P and 203N, which may be a differential output, is supplied to respective feedback ADCs 108P and 108N. The output of the feedback ADCs 108P and 108N are provided to the respective digital gain elements 204P and 204N.

In use the gain of the PGAs 605P and 605N are controlled, at least partly, based on an indication of the signal level of the input signal $D_{IN}$ in a similar manner as discussed previously. It will be understood that the signals at the first and second output nodes 103P and 103N will be of substantially the same magnitude, but opposite polarity, and thus the input signal $D_{IN}$ can be used to determine a suitable analogue gain $G_A$ for both the first and second feedback paths and also corresponding digital gains $G_D$. The audio circuit 601 may thus comprise a gain controller 205, which may, in some implementations, have an envelope detector 301 and control logic 302 as discussed previously. As noted previously the digital input signal $D_{IN}$ for the gain controller 205 may be tapped from upstream of a processing module 304, which may for instance comprise an interpolation filter or the like, and which may provide an inherent or deliberately introduced propagation delay to allow time for the relevant analogue and digital gains to be determined.

The respective digital feedback signals $D_{FBP}$ and $D_{FBN}$ are then applied to the first and second forward signal paths respectively by processing modules 111P and 111N, which may for instance include loop filters 501P and 501N arranged as generally discussed with respect to FIG. 5a. This provides an audio circuit arrangement with the benefit of feedback but without requiring a very high performance feedback ADC.

This arrangement outputs a differential output signal in a pseudo-differential arrangement, with separate feedback for the first and second forward signal paths. Such an arrangement can also be advantageous in terms of power supply rejection ratio. As will be understood by one skilled in the art power supply variations can be seen as a noise terms that may modulate the response of various components of a processing path. For a class-D driver circuit arrangement any supply noise may, in particular, modulate the response of the output stage 603.

In the arrangement of FIG. 6a, with a differential output stage the supply variation may affect both the output stage 603P and 603N in the same way, thus providing a modulation in the first and second signal paths that varies the common-mode voltage. The first and second feedback paths provide feedback to the first and second forward signal paths, referenced to the decoupled supply voltage provided to the PGAs 203 via the low-pass filter 607 to stabilise the common-mode voltage.

Ideally the first and second feedback paths would have identical signal transfer functions (STFs) so as eliminate any supply noise. In practice though it will be understood by one skilled in the art that there may be resistor mismatches which can lead to the PGAs 203P and 203N having different transfer functions, i.e. different gains, in use. However in the arrangement of FIG. 6a the effect of any mismatch is mitigated by the gain of the loop filter 501.

Consider that the level of the input signal $D_{IN}$ is represented by X and the output signals at the first and second output nodes 103P and 103N are $Y_P$ and $Y_N$ respectively. Assume, for ease of analysis, that the signal transfer function (STFs) of the modulators 604 together with output stages 603 is equal to unity and likewise the STF of feedback ADC is also equal to unity. In such a case the output $Y_P$ at the first output node 103P is a function of the gain H of the loop filter 501P and also the gain $K_P$ of PGA 203P. Likewise the output $Y_N$ at the second output node 103P is a function of the gain of the loop filter 501N (which will typically be the same as loop filter 501P, i.e. H) and also the gain $K_N$ of PGA 203N.

Supply noise can be modelled as an input Q applied in the same way to both processing paths at the output stage 603.

$$Y_P = \left(\frac{1+H}{1+K_P H}\right)X + \left(\frac{1}{1+K_P H}\right)Q \quad Y_N = \quad \text{Eqn. (1)}$$

$$\left(\frac{-(1+H)}{1+K_N H}\right)X + \left(\frac{1}{1+K_N H}\right)Q$$

The differential signal $Y=Y_P-Y_N$ is thus equal to:

$$Y = \left[\left(\frac{1+H}{1+K_P H}\right) - \left(\frac{-(1+H)}{1+K_N H}\right)\right] \quad \text{Eqn. (2)}$$

$$X + \left[\left(\frac{1}{1+K_P H}\right) - \left(\frac{1}{1+K_N H}\right)\right]Q$$

The supply noise term can be rewritten as:

$$\left[\frac{(K_N - K_P)H}{(1+K_P H)(1+K_N H)}\right]Q \quad \text{Eqn. (3)}$$

or:

$$\left[\frac{(K_N - K_P)}{\left(\frac{1}{H} + K_P + K_N + K_P \cdot K_N \cdot H\right)}\right]Q \quad \text{Eqn. (4)}$$

It can thus be seen that the noise term thus depends on the extent of any variation between the PGAs 203P and 203N. It will also be seen however that gain H of the loop filter 501 remains part of the denominator and that a higher loop gain thus results in better PSRR.

Figure 6B:
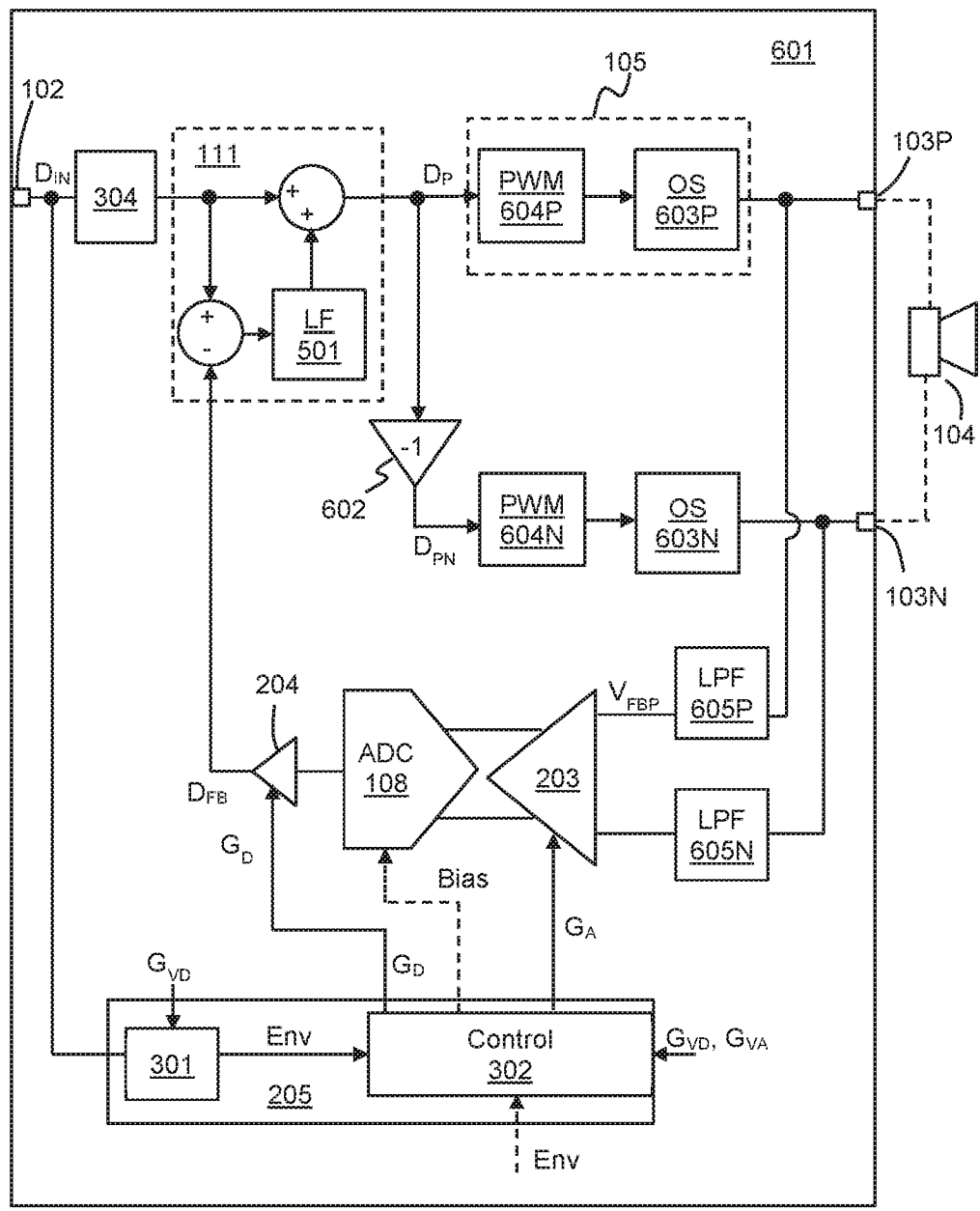

The audio circuit illustrated in FIG. 6a thus provides a differential output signal suitable for driving a bridge-tied load for example, and is a pseudo-differential arrangement with separate feedback paths. An alternative, as illustrated in FIG. 6b would be to provide differential feedback. FIG. 6b illustrates an audio circuit where an input signal $D_{IN}$ is received and feedback applied by processing module before the processed signal $D_P$ is tapped and inverted by inverter 602 to provide a signal $D_{PN}$ for the second forward signal path. Each of the first and second forward signal paths has a class-D output state 603 and modulator 604 as discussed with reference to FIG. 6a.

In the embodiment of FIG. 6b feedback signals indicative of the output of the first and second output stages 603P and 603N are filtered by low pass filters 605P and 605N and input to a differential-input, differential output PGA 203. PGA 203 may comprise a single differential-input, differential-output op amp, or may comprise two or more op amps.

In this embodiment the output of the PGA 203 is input to a differential ADC 108 which determines a digital feedback value $D_{FB}$ as the difference between the outputs of the PGA 203.

It can be shown that for an arrangement such as illustrated in FIG. 6b, with differential feedback, the supply noise can be seen to have the general form as illustrated in equation 4, but without the $K_P \cdot K_N \cdot H$ term. Thus the PSRR of the audio circuit of FIG. 6b is determined mainly by any resistor mismatch and is not as dependent on loop filter gain as the circuit of FIG. 6a.

Note that as used herein the terms 'module' and 'block' shall both be used to refer to a functional unit for performing the stated function. A module or block may be implemented at least partly by dedicated hardware components such as custom defined circuitry and/or at least partly be implemented by one or more software processors or appropriate code running on a suitable general purpose processor or the like. The appropriate code may be stored in memory in the host device. It should also be noted that any components forming part of one module or block may be shared with another module or block and/or the same processor may implement multiple modules or blocks and may already be performing other control or data processing, which include other processing of the audio signal, e.g. pre-conditioning of the audio signal data stream.

The amplifier module 102 may comprise any type of amplifier, for instance of the Class AB type (possibly with Class G or H type power tracking) or a Class D type amplifier (in which case there may be off-chip filter components) whether with fixed or variable power rails. In particular the amplifier module may have variable gain.

Embodiments have been described with reference to an audio driving circuit for driving an audio transducer, which may be an audio transducer or an external device. A reference to an audio transducer shall be taken to include ultrasonic or haptic transducers. The principles of the disclosure would also be applicable to other types of audio circuitry that receive a digital audio signal and output an analogue audio signal. The principles would also be applicable to other types of non-audio signal.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up controlling an ASIC or FPGA. The code may also comprise code for dynamically configuring re-configurable apparatus such as re-programmable logic gate arrays. Similarly, the code may comprise code for a hardware description language such as Verilog™ or VHDL. AS the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more speakers may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. An audio circuit comprising:
a forward signal path with an input for an input digital audio signal and an output for an output analogue audio signal;
a feedback path electrically coupled to the forward signal path, the feedback path comprising an analogue-to-digital conversion module for receiving an analogue feedback signal derived from the output analogue audio signal and outputting a corresponding digital feedback signal;
wherein the analogue-to-digital conversion module comprises an analogue-to-digital converter (ADC); an analogue gain element configured to apply analogue gain to the analogue feedback signal before the ADC; and a digital gain element for applying digital gain to a signal output from the ADC; and
a gain controller for controlling the analogue gain and the digital gain applied based on the input digital audio signal, wherein the analogue gain element is a variable analogue gain element and the digital gain element is a variable digital gain element and the gain controller selectively controls the analogue gain of the variable analogue gain element and the digital gain of the variable digital gain element.

2. An audio circuit as claimed in claim 1 wherein the gain controller is configured to control the analogue gain and the digital gain such that digital gain at least partly reverses the analogue gain applied by the analogue gain element.

3. An audio circuit as claimed in claim 1 wherein said ADC, said analogue gain element and said digital gain element are located in a first ADC path and wherein the analogue-to-digital conversion module comprises at least one further ADC path configured to receive the analogue feedback signal, wherein each further ADC path comprises an ADC and is configured to apply different amounts of analogue gain and digital gain; and wherein the gain controller selects the ADC paths that contribute to the digital feedback signal.

4. An audio circuit as claimed in claim 1 wherein the gain controller is configured to receive a version of the input digital audio signal.

5. An audio circuit as claimed in claim 4 wherein the gain controller is configured to receive the version of the input digital audio signal which is tapped from the forward signal path upstream of a digital module that has an associated digital propagation delay.

6. An audio circuit as claimed in claim 1 wherein the forward signal path comprises a digital variable gain module for applying a variable digital gain to the forward signal path.

7. An audio circuit as claimed in claim 6 wherein the gain controller is configured to receive an indication of the variable digital gain applied to the forward signal path.

8. An audio circuit as claimed in claim 1 comprising a digital-to-analogue converter (DAC) in the forward signal path.

9. An audio circuit as claimed in claim 8 comprising an analogue amplifier in the forward signal path downstream of the DAC, wherein the analogue amplifier is operable to provide a variable amplification gain and wherein the gain controller is configured to receive an indication of the amplification gain and to control the analogue gain and the digital gain applied by the analogue-to-digital conversion module also based on the amplification gain.

10. An audio circuit as claimed in claim 1 wherein said forward signal path is a first forward signal path and the audio circuit further comprises a second forward signal path that extends between a branch node of the first signal path and a second output for an output analogue audio signal.

11. An audio circuit as claimed in claim 10 wherein:
said feedback path is a first feedback path for receiving said analogue feedback signal derived from the output analogue audio signal at the output of the first forward signal path and for outputting a corresponding digital feedback signal for processing in the first forward signal path downstream of the branch node; and
the audio circuit further comprises a second feedback path comprising a second analogue-to-digital conversion module for receiving a second analogue feedback signal derived from the output analogue audio signal at the output of the second forward signal path and outputting a corresponding digital feedback signal for processing in the second forward signal path.

12. An audio circuit as claimed in claim 11 wherein:
said second analogue-to-digital conversion module comprises a second analogue-to-digital converter (ADC); a second analogue gain element configured to apply analogue gain to the second analogue feedback signal before the second ADC; and a second digital gain element for applying digital gain to a signal output from the second ADC; and
said gain controller is configured to control the analogue gains and the digital gains applied by analogue-to-digital conversion modules of both the first and second feedback paths based on the input digital audio signal.

13. An audio circuit as claimed in claim 10 wherein said analogue-to-digital conversion module of said feedback path is configured for receiving said analogue feedback signal derived from the output analogue audio signal at the output of the first forward signal path and also a second analogue feedback signal derived from the output analogue audio signal at the output of the second forward signal path and the audio circuit is configured to modulate the first forward signal path upstream of the branch node based on said digital feedback signal.

14. An audio circuit as claimed in claim 1 implemented as an integrated circuit.

15. An audio apparatus comprising an audio circuit as claimed in claim 1.

16. An audio apparatus as claimed in claim 15 wherein the output of the audio circuit is coupled to an output audio path that comprises at least one non-linear component wherein said analogue feedback signal is derived from the output audio path downstream of the at least one non-linear component.

17. An audio apparatus as claimed in claim 15 further comprising a first connector for removably connecting to a mating second connector of a peripheral device wherein the apparatus is operable, in use, to supply the output analogue audio signal to the first connector for driving an audio transducer of a connected peripheral device.

18. An audio apparatus as claimed in claim 15 wherein the audio apparatus comprises at least one of: a battery powered device; a portable device; a communications device; a mobile telephone; a smartphone; a computing device; a laptop; notebook or tablet computer; a gaming device; a personal media player; a wearable device; a voice controlled device.

19. An audio circuit comprising:
a forward signal path having an input node for receiving an input digital audio signal;
a signal processing module for the processing the input digital audio signal;
a feedback node, electrically coupled to the forward signal path, for receiving an analogue feedback signal derived from said input digital audio signal;
an analogue gain element configured to receive the analogue feedback signal and apply a controlled analogue gain;
an analogue-to-digital converter (ADC) configured to receive the output of the analogue gain element;
a digital gain element configured to receive an output of the ADC and apply a controlled digital gain; and
a gain controller configured to receive a version of input digital audio signal and control the analogue gain and the digital gain based on the input digital audio signal.

20. An audio circuit comprising:
a forward signal path for receiving an input digital audio signal and outputting an output analogue audio signal;
a feedback path, electrically coupled to the forward signal path, for receiving an analogue feedback signal derived from the output analogue audio signal; and
a gain controller for controlling an analogue gain and a digital gain applied before and after an analogue-to-digital converter (ADC) in the feedback path based on the input digital audio signal.

* * * * *